(12) United States Patent
Jiang et al.

(10) Patent No.: US 12,027,431 B2
(45) Date of Patent: Jul. 2, 2024

(54) SEMICONDUCTOR STRUCTURE AND METHOD OF MAKING

(71) Applicant: TAIWAN SEMICONDUCTOR MANUFACTURING COMPANY LIMITED, Hsin-Chu (TW)

(72) Inventors: Jheng-Hong Jiang, Hsinchu (TW); Shing-Huang Wu, Hsinchu (TW); Chia-Wei Liu, Zhubei (TW)

(73) Assignee: TAIWAN SEMICONDUCTOR MANUFACTURING COMPANY LIMITED, Hsin-Chu (TW)

(*) Notice: Subject to any disclaimer, the term of this patent is extended or adjusted under 35 U.S.C. 154(b) by 296 days.

(21) Appl. No.: 17/348,858

(22) Filed: Jun. 16, 2021

(65) Prior Publication Data
US 2022/0301951 A1   Sep. 22, 2022

Related U.S. Application Data

(60) Provisional application No. 63/163,717, filed on Mar. 19, 2021.

(51) Int. Cl.
*H01L 23/00* (2006.01)
*H01L 21/66* (2006.01)
*H01L 21/768* (2006.01)

(52) U.S. Cl.
CPC ........ *H01L 22/32* (2013.01); *H01L 21/76877* (2013.01); *H01L 22/14* (2013.01)

(58) Field of Classification Search
CPC ........... H01L 23/5226; H01L 21/76816; H01L 21/76877; H01L 23/5223
See application file for complete search history.

(56) References Cited

U.S. PATENT DOCUMENTS

| | | | | |
|---|---|---|---|---|
| 7,745,865 B2* | 6/2010 | Tu | ........................... | H01L 28/60 257/311 |
| 7,858,483 B2* | 12/2010 | Choi | ....................... | H01L 28/75 438/668 |
| 10,797,183 B2* | 10/2020 | Takeuchi | .............. | H01L 21/822 |
| 2002/0106856 A1* | 8/2002 | Lee | ........................ | H10B 12/09 438/398 |
| 2015/0028450 A1* | 1/2015 | Park | .................. | H01L 21/76898 257/532 |
| 2021/0005597 A1* | 1/2021 | Fujiwara | ................. | H01L 28/60 |
| 2022/0285296 A1* | 9/2022 | Jiang | ....................... | H01L 23/66 |
| 2022/0367640 A1* | 11/2022 | Sundaresan | ......... | H01L 29/7802 |

\* cited by examiner

*Primary Examiner* — Anthony Ho
*Assistant Examiner* — David J Goodwin
(74) *Attorney, Agent, or Firm* — Cooper Legal Group, LLC

(57) ABSTRACT

A method of forming a semiconductor structure includes forming a first conductive contact in a first dielectric layer coupled to a first device and forming a second conductive contact in the first dielectric layer coupled to a second device. A first trench is formed in the first dielectric layer having a first depth and exposing at least a portion of the first conductive contact. A second trench is formed in the first dielectric layer having a second depth different than the first depth and exposing at least a portion of the second conductive contact. A first conductive layer is formed in the first trench and the second trench. A second dielectric layer is formed in the first trench and the second trench over the first conductive layer.

20 Claims, 11 Drawing Sheets

SEMICONDUCTOR STRUCTURE AND METHOD OF MAKING

RELATED APPLICATIONS

This application claims priority to U.S. Provisional Application 63/163,717, titled "SEMICONDUCTOR ARRANGEMENT AND METHOD OF MANUFACTURE" and filed on Mar. 19, 2021, which is incorporated herein by reference.

BACKGROUND

Monitoring structures are useful for, among other things, allowing measurements of characteristics of a semiconductor structure during or after fabrication.

DESCRIPTION OF THE DRAWINGS

Aspects of the disclosure are understood from the following detailed description when read with the accompanying drawings. It will be appreciated that elements and/or structures of the drawings are not necessarily be drawn to scale. Accordingly, the dimensions of the various features may be arbitrarily increased and/or reduced for clarity of discussion.

DETAILED DESCRIPTION

Figure 1:
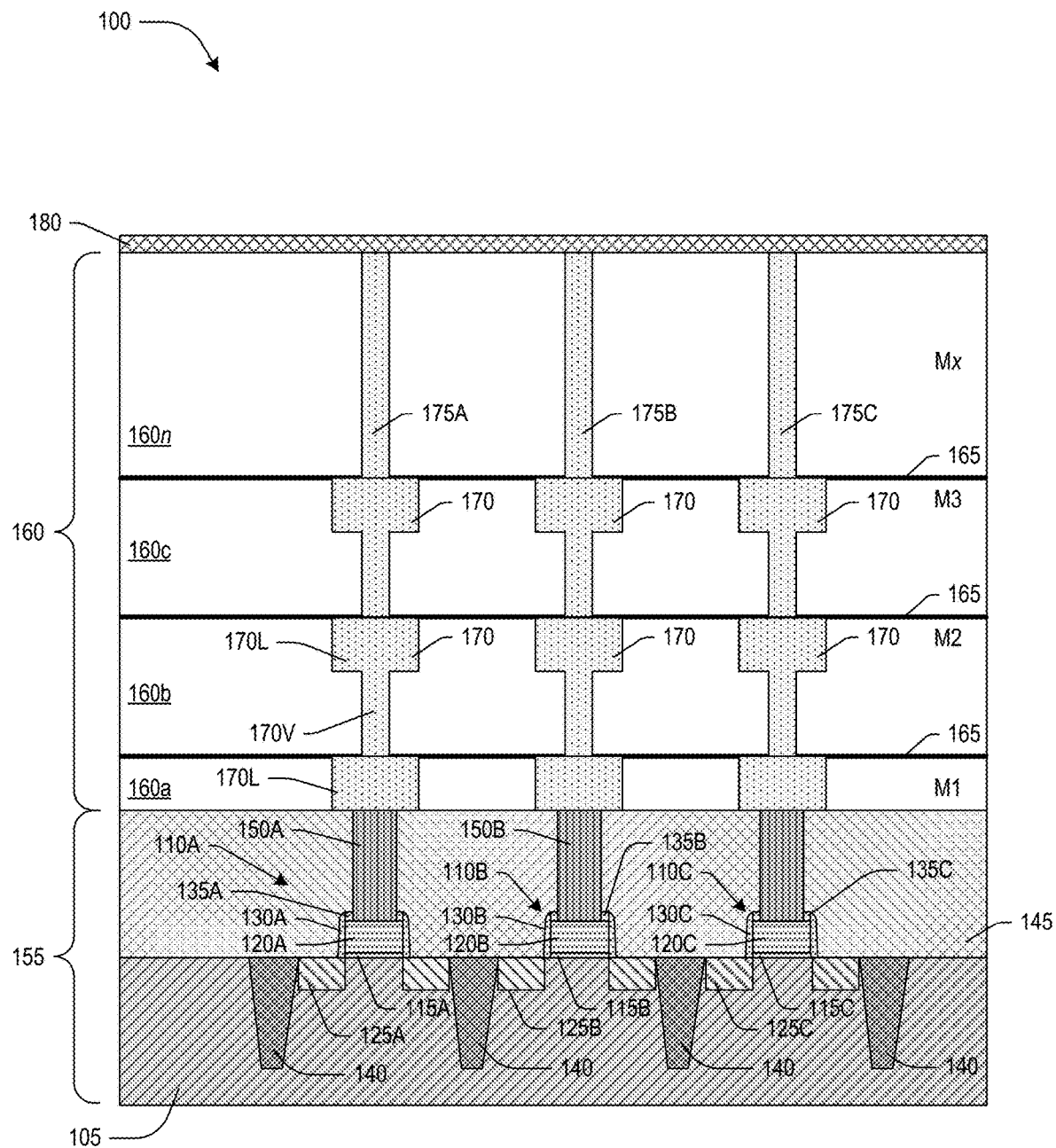
FIGS. 1-6 are cross-section views of a semiconductor structure at various stages of fabrication, in accordance with some embodiments.

The following disclosure provides many different embodiments, or examples, for implementing different features of the provided subject matter. Specific examples of components and arrangements are described below to simplify the present disclosure. These are, of course, merely examples and are not intended limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One or more techniques for forming a semiconductor structure and resulting structures formed thereby are provided herein. According to some embodiments, the present application relates to a semiconductor structure and a method for fabricating a semiconductor structure. According to some embodiments, multiple trench resonators are provided in a scribe line of a semiconductor wafer. Each trench resonator includes trenches of different depths, a conductive layer lines the trenches, and a dielectric material is over the conductive layer in the trenches. In some embodiments, the conductive layers are connected to underlying devices. In some embodiments, the material composition of the conductive layer differs between different instances of the trench resonator. An additional dielectric layer and conductive cap layer are formed over the trench resonators. In some embodiments, the material composition of the dielectric layer differs between trench resonators. The trench resonators may be used to monitor various metrics during the fabrication of the semiconductor structure 100. Fabrication metrics, such as overlay, critical dimension (CD), stress, charging characteristics, radio frequency (RF) performance, or other suitable fabrication metrics may be monitored.

FIG. 1 is a cross-section view illustrating a portion of a semiconductor structure 100 according to some embodiments. In an embodiment, the semiconductor structure 100 is formed on a substrate layer 105 comprising at least one of an epitaxial layer, a single crystalline semiconductor material such as, but not limited to at least one of Si, Ge, SiGe, InGaAs, GaAs, InSb, GaP, GaSb, InAlAs, GaSbP, GaAsSb, and InP, a silicon-on-insulator (SOI) structure, a wafer, or a die formed from a wafer. In some embodiments, the substrate layer 105 comprises at least one of crystalline silicon or other suitable materials. Other structures and/or configurations of the substrate layer 105 are within the scope of the present disclosure.

According to some embodiments, the semiconductor structure 100 comprises a first device 110A, a second device 110B, and a third device 110C formed on or within the substrate layer 105. In some embodiments, the first device 110A, the second device 110B, and the third device 110C each comprises a gate dielectric layer 115A, 115B, 115C, a gate electrode 120A, 120B, 120C, source/drain regions 125A, 125B, 125C, a sidewall spacer 130A, 130B, 130C, a gate cap layer 135A, 135B, 135C, etc. According to some embodiments, the gate dielectric layer 115A, 115B, 115C and the gate electrode 120A, 120B, 120C are formed using a gate replacement process. A sacrificial gate structure comprising a sacrificial gate dielectric layer, a sacrificial gate electrode layer, such as a polysilicon layer, and a hard mask layer are formed. In some embodiments, a patterning process is performed to pattern the hard mask layer corresponding to a pattern of gate structures to be formed, and an etch process is performed using the patterned hard mask layer to etch the sacrificial gate electrode layer and the sacrificial gate dielectric layer to define the sacrificial gate structure. In some embodiments, remaining portions of the hard mask layer form a cap layer over the portions of the sacrificial gate electrode layer remaining after the etch process. The sacrificial gate structure is later replaced with a replacement gate dielectric layer, such as the gate dielectric layer 115A, 115B, 115C and a replacement gate electrode, such as the gate electrode 120A, 120B, 120C.

In some embodiments, the gate dielectric layer 115A, 115B, 115C comprises a high-k dielectric material. As used herein, the term "high-k dielectric" refers to the material having a dielectric constant, k, greater than or equal to about 3.9, which is the k value of $SiO_2$. The high-k dielectric material may be any suitable material. Examples of the high-k dielectric material include but are not limited to $Al_2O_3$, $HfO_2$, $ZrO_2$, $La_2O_3$, $TiO_2$, $SrTiO_3$, $LaAlO_3$, $Y_2O_3$, $Al_2O_xN_y$, $HfO_xN_y$, $ZrO_xN_y$, $La_2O_xN_y$, $TiO_xN_y$, $SrTiO_xN_y$, $LaAlO_xN_y$, $Y_2O_xN_y$, $SiON$, $SiN_x$, a silicate thereof, and an alloy thereof. Each value of x is independently from 0.5 to 3, and each value of y is independently from 0 to 2. In some embodiments, the gate dielectric layer 115A, 115B, 115C comprises a native oxide layer formed by exposure of the semiconductor structure 100 to oxygen at various points in the process flow, causing the formation of silicon dioxide on exposed surfaces of the substrate layer 105. In some embodiments, an additional layer of dielectric material, such as silicon dioxide, a high-k dielectric material, or other suitable material, is formed over the native oxide to form the gate dielectric layer 115A, 115B, 115C.

In some embodiments, the gate electrode 120A, 120B, 120C comprises a barrier layer, one or more work function material layers, a seed layer, a metal fill layer, or other suitable layers. In some embodiments, the metal fill layer comprises tungsten, aluminum, copper, cobalt, or other suitable material. In some embodiments, the gate dielectric layer 115A, 115B, 115C and the one or more layers that comprise the gate electrode 120A, 120B, 120C are deposited by at least one of atomic layer deposition (ALD), physical vapor deposition (PVD), chemical vapor deposition (CVD), low pressure CVD (LPCVD), atomic layer chemical vapor deposition (ALCVD), ultrahigh vacuum CVD (UHVCVD), reduced pressure CVD (RPCVD), molecular beam epitaxy (MBE), or other suitable techniques. In some embodiments, the gate electrode 120A, 120B, 120C is recessed and the gate cap layer 135A, 135B, 135C is formed in the recess.

In some embodiments, the sidewall spacer 130A, 130B, 130C is formed adjacent the gate dielectric layer 115A, 115B, 115C and the gate electrode 120A, 120B, 120C. In some embodiments, the sidewall spacer 130A, 130B, 130C is formed by depositing a spacer layer over the sacrificial gate structure and performing an anisotropic etch process to remove horizontal portions of the spacer layer. In some embodiments, the sidewall spacer 130A, 130B, 130C comprises silicon nitride or other suitable materials.

In some embodiments, the source/drain regions 125A, 125B, 125C are formed in the substrate layer 105 after forming the sacrificial gate structure. For example, in some embodiments, portions of the substrate layer 105 are doped through an implantation process to form the source/drain regions 125A, 125B, 125C. In some embodiments, an etch process is performed to recess the substrate layer 105 adjacent the sidewall spacer 130A, 130B, 130C, and an epitaxial growth process is performed to form the source/drain regions 125A, 125B, 125C.

In an embodiment, one or more shallow trench isolation (STI) structures 140 are formed within the substrate layer 105. In some embodiments, the STI structures 140 are formed by forming at least one mask layer over the substrate layer 105. In some embodiments, the at least one mask layer comprises a layer of oxide material over the substrate layer 105 and a layer of nitride material over the layer of oxide material, and/or one or more other suitable layers. At least some of the at least one mask layer is removed to define an etch mask for use as a template to etch the substrate layer 105 to form trenches. A dielectric material is formed in the trenches to define the STI structure 140. In some embodiments, the STI structures 140 include multiple layers, such as an oxide liner, a nitride liner formed over the oxide liner, an oxide fill material formed over the nitride liner, and/or other suitable materials.

In some embodiments, a fill material, such as the oxide fill material, is formed using a high density (HDP) plasma process. The HDP process uses precursor gases comprising at least one of silane ($SiH_4$), oxygen, argon, or other suitable gases. The HDP process includes a deposition component, which forms material on surfaces defining the trench, and a sputtering component, which removes or relocates deposited material. A deposition-to-sputtering ratio depends on gas ratios employed during the deposition component. According to some embodiments, argon and oxygen act as sputtering sources, and the particular values of the gas ratios are determined based on an aspect ratio of the trench. After forming the fill material, an anneal process is performed to densify the fill material. In some embodiments, the STI structures 140 generate compressive stress.

Although the substrate layer 105 and the STI structures 140 are illustrated as having coplanar upper surfaces at an interface where the substrate layer 105 abuts the STI structures 140, the relative heights can vary. For example, the STI structures 140 can be recessed relative to the substrate layer 105 or the substrate layer 105 can be recessed relative to the STI structures 140. The relative heights at the interface depend on the processes performed for forming the STI structures 140, such as at least one of deposition, planarization, mask removal, surface treatment, or other suitable techniques. In some embodiments, the STI structures 140 are formed prior to forming the devices 110A, 110B, 110C. Other structures and/or configurations of the STI structures 140 are within the scope of the present disclosure.

In some embodiments, the devices 110A, 110B, 110C are formed using the same materials and layer thicknesses. In some embodiments, different materials and/or thicknesses may be used due to the different voltage domains. For example, the material and/or thickness of the gate dielectric layers 115A, 115B, 115C may differ from one another. Although the devices 110A, 110B, 110C are illustrated as being adjacent one other, in some embodiments, the devices 110A, 110B, 110C are formed in different regions. For example, if the gate dielectric layers 115A, 115B, 115C vary in thickness or material, the differing devices 110A, 110B, 110C may be formed in different regions. In some embodiments, the materials of the gate electrode 120A, 120B, 120C may also differ. Other structures and configurations of the devices 110A, 110B, 110C are within the scope of the present disclosure. For example, the devices 110A, 110B, 110C may be fin field-effect transistor (finFET) devices, nanosheet devices, nanowire devices, or some other suitable device.

In some embodiments, a dielectric layer 145 is formed over the devices 110A, 110B, 110C. In some embodiments, the dielectric layer 145 is formed prior to forming the replacement gate structures, if applicable. In some embodiments, the dielectric layer 145 comprises silicon dioxide or a low-k dielectric material. In some embodiments, the dielectric layer 145 comprises one or more layers of low-k dielectric material. Low-k dielectric materials have a k value lower than about 3.9. In some embodiments, the material for the dielectric layer 145 comprise at least one of Si, O, C, or H, such as SiCOH, SiOC, oxygen-doped SiC (ODC), nitrogen-doped SiC (NDC), plasma-enhanced oxide (PEOX), or other suitable materials. A low-k dielectric material is, in some embodiments, further characterized or classified as ultra low-k (ULK), extra low-k (ELK), or extreme low-k (XLK), where the classification is generally based upon the k value. For example, ULK generally refers to materials with a k value of between about 2.7 to about 2.4, ELK generally refers to materials with a k value of between about 2.3 to about 2.0, and XLK generally refers to materials with a k value of less than about 2.0. Organic material, such as polymers, may be used for the dielectric layer 145. In some embodiments, the dielectric layer 145 comprises one or more layers of a carbon-containing material, organo-silicate glass, a porogen-containing material, or combinations thereof. The dielectric layer 145 comprises nitrogen in some embodiments. In some embodiments, the dielectric layer 145 is formed by using, for example, at least one of CVD, plasma-enhanced chemical vapor deposition (PECVD), LPCVD, ALCVD, a spin-on technology, or some other suitable process.

In some embodiments, the semiconductor structure 100 comprises one or more conductive contacts 150A, 150B, 150C formed in the dielectric layer 145. The conductive contacts 150A, 150B, 150C are formed in any number of ways, such as by a single damascene process, a dual damascene process, a trench silicide process, or some other suitable process. In some embodiments, the conductive contacts 150A, 150B, 150C contact the gate electrodes 120A, 120B, 120C and additional contacts (not shown) are formed to contact the source/drain regions 125A, 125B, 125C in different positions along the axial lengths of the devices 110A, 110B, 110C, such as into or out of the page. In some embodiments, the conductive contacts 150A, 150B, 150C comprise a barrier layer, a seed layer, a metal fill layer, or other suitable layers. In some embodiments, the metal fill layer comprises tungsten, aluminum, copper, cobalt, or other suitable material. In some embodiments, the devices 110A, 110B, 110C, the conductive contacts 150A, 150B, 150C, and the dielectric layer 145 define a device layer 155 of the semiconductor structure 100. Other structures and configurations of the conductive contacts 150A, 150B, 150C are within the scope of the present disclosure.

In some embodiments, the semiconductor structure 100 comprises one or more dielectric layers 160 formed over the device layer 155. According to some embodiments, the one or more dielectric layers 160 comprise a second dielectric layer 160a, a third dielectric layer 160b, a fourth dielectric layer 160c, and an n-th dielectric layer 160n. Any number of dielectric layers 160 are contemplated. In some embodiments, at least one of the dielectric layers 160 comprises a standard dielectric material with a medium or low dielectric constant, such as SiO$_2$. In some embodiments, at least one of the dielectric layers 160 comprises a dielectric material with a relatively low dielectric constant, as described for the dielectric layer 145. The dielectric layers 160 are formed in any number of ways, such as by thermal growth, chemical growth, ALD, CVD, PECVD, or some other suitable process. In some embodiments, one or more of the dielectric layers 160 in a lower portion comprise ULK or ELK dielectric materials, one or more of the dielectric layers 160 in an intermediate portion comprise low-k dielectric materials, and one or more of the dielectric layers 160 in an upper portion comprise standard-k dielectric materials, such as doped or undoped silicon glass.

In some embodiments, the semiconductor structure 100 comprises one or more etch stop layers 165 separating the dielectric layers 160. In some embodiments, the etch stop layers 165 stop an etching process between the dielectric layers 160. According to some embodiments, the etch stop layers 165 comprise a dielectric material having a different etch selectivity from the dielectric layers 160. In some embodiments, at least one of the etch stop layers 165 comprises SiN, SiCN, SiCO, CN, etc., alone or in combination. The etch stop layers 165 are formed in any number of ways, such as by thermal growth, chemical growth, ALD, CVD, PECVD, or some other suitable process.

In some embodiments, the semiconductor structure 100 comprises one or more conductive contacts 170, 175A, 175B, 175C. In some embodiments, the conductive contacts 170, 175A, 175B, 175C extend through their respective dielectric layers 160. In some embodiments, some of the conductive contacts 170 comprise a via portion 170V and a line portion 170L. In some embodiments, the line portions 170L have an axial length extending into the page. In some embodiments, the conductive contacts 170, 175A, 175B, 175C comprise a barrier layer, a seed layer, a metal fill layer, or other suitable layers. In some embodiments, the metal fill layer comprises tungsten, aluminum, copper, cobalt, or other suitable material. Other structures and configurations of the conductive contacts 170, 175A, 175B, 175C are within the scope of the present disclosure. The combination of a particular dielectric layer 160 and the associated conductive contact 170, 175A, 175B, 175C in the particular dielectric layer 160 define a metallization layer, such as metallization layers "M1," "M2," "M3", and "Mx."

A mask layer 180 is formed over the n-th dielectric layer 160n, according to some embodiments. In some embodiments, the mask layer 180 comprises a plurality of individually formed layers that together define a mask stack. In some embodiments, the mask layer 180 comprises at least one of a hard mask layer, a bottom antireflective coating (BARC) layer, an organic planarization layer (OPL), or a photoresist layer.

The hard mask layer is formed by at least one of PVD, sputtering, CVD, LPCVD, ALCVD, UHVCVD, RPCVD, ALD, MBE, liquid phase epitaxy (LPE), spin on, growth, or other suitable techniques. In some embodiments, the hard mask layer comprises at least one of silicon, nitrogen, or other suitable materials. In some embodiments, the BARC layer is a polymer layer that is applied using a spin coating process.

In some embodiments, the OPL comprises a photo-sensitive organic polymer that is applied using a spin coating process. In some embodiments, the OPL comprises a dielectric layer. In some embodiments, the photoresist layer is formed by at least one of spinning, spray coating, or other suitable techniques.

The photoresist is a negative photoresist or a positive photoresist. With respect to a negative photoresist, regions of the negative photoresist become insoluble when illuminated by a light source, such that application of a solvent to the negative photoresist during a subsequent development stage removes non-illuminated regions of the negative photoresist. A pattern formed in the negative photoresist is thus a negative image of a pattern defined by opaque regions of a template, such as a mask, between the light source and the negative photoresist. In a positive photoresist, illuminated regions of the positive photoresist become soluble and are removed via application of a solvent during development. Thus, a pattern formed in the positive photoresist is a positive image of opaque regions of the template, such as a mask, between the light source and the positive photoresist. One or more etchants have a selectivity such that the one or more etchants remove or etch away one or more layers exposed or not covered by the photoresist at a greater rate than the one or more etchants remove or etch away the photoresist. Accordingly, an opening in the photoresist allows the one or more etchants to form a corresponding opening in the one or more layers under the photoresist, and thereby transfer a pattern in the photoresist to the one or more layers under the photoresist. The photoresist is stripped or washed away after the pattern transfer.

Figure 2:
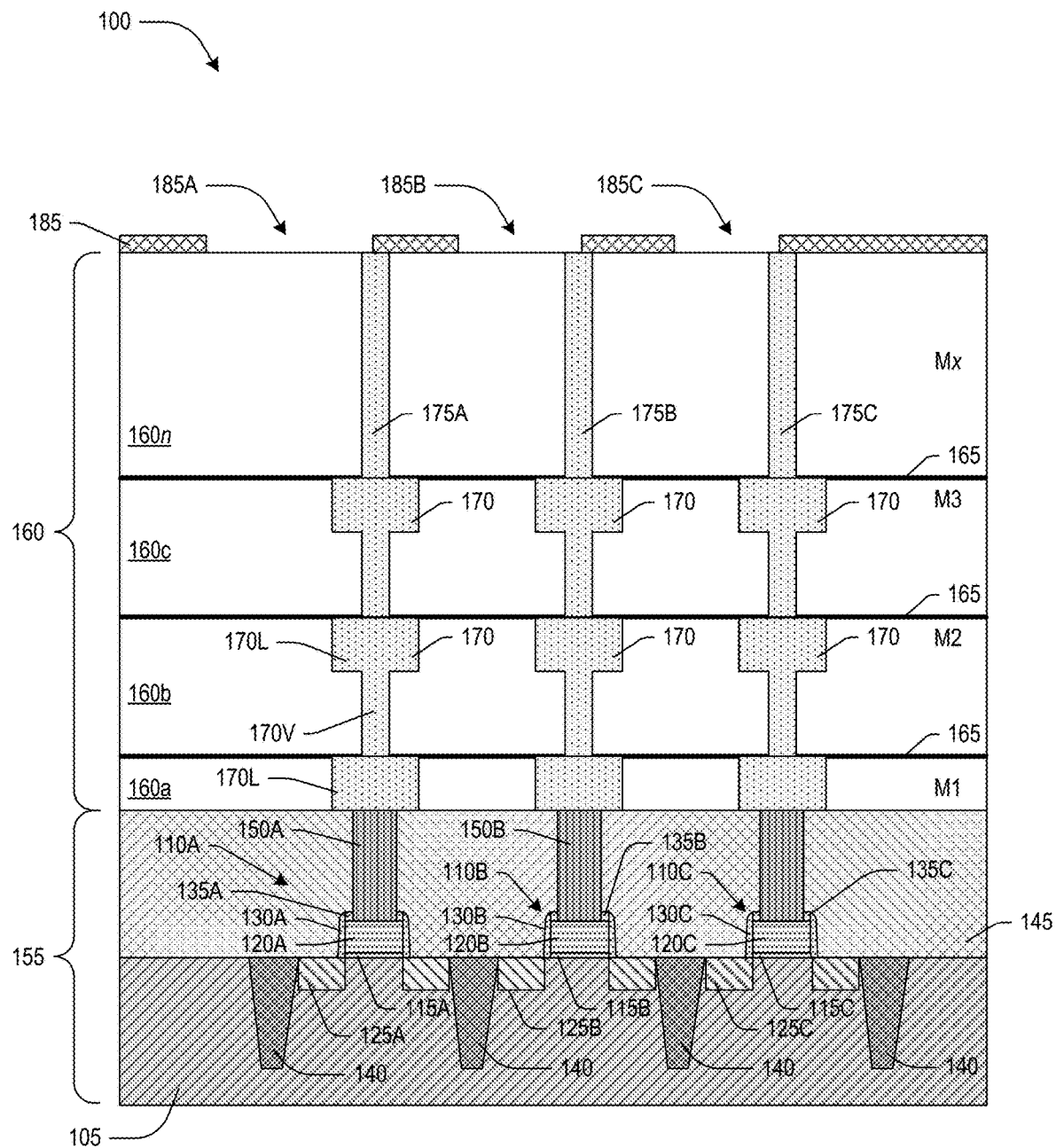

Referring to FIG. 2, the mask layer 180 is patterned to define a mask 185, in accordance with some embodiments. In some embodiments, the photoresist layer is exposed using a radiation source and a reticle to define a pattern in the photoresist layer and portions of the photoresist layer are removed to define a patterned photoresist layer. OPL, BARC layer, and/or hard mask layer underlying the photoresist layer are etched using the patterned photoresist layer as a template to form the mask 185 to define mask openings 185A, 185B, 185C exposing portions of the n-th dielectric layer 160n and the conductive contacts 175A, 175B, 175C under the mask 185.

Figure 3:
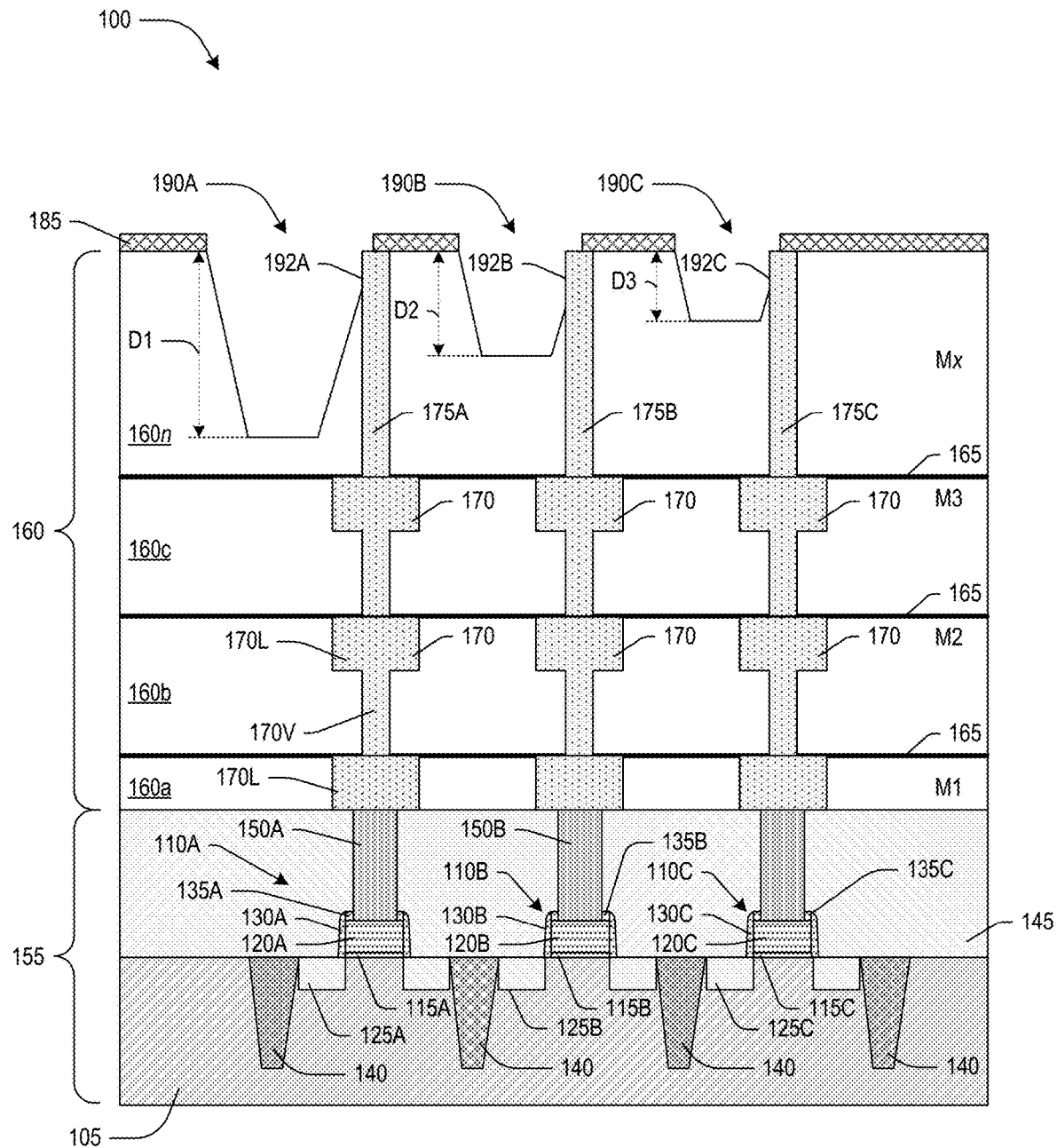

Referring to FIG. 3, trenches 190A, 190B, 190C are formed in the dielectric layer 160n, in accordance with some embodiments. In some embodiments, an etching process is performed to pattern the dielectric layer 160n using the mask 185 as an etch template to define the trenches 190A, 190B, 190C in the dielectric layer 160n, in accordance with some embodiments. According to some embodiments, the trenches 190A, 190B, 190C expose portions 192A, 192B, 192C of the sidewalls of the conductive contacts 175A, 175B, 175C, respectively. The etching process comprises at least one of a plasma etching process, a reactive ion etching (RIE) process, or other suitable techniques. The etch process comprises an anisotropic etch process, in accordance with some embodiments. In some embodiments, the trenches 190A, 190B, 190C have different depths D1, D2, D3. A multiple step etching process with intermediate etch masks may be performed to provide the different depths D1, D2, D3 of the trenches 190A, 190B, 190C.

Figure 4:
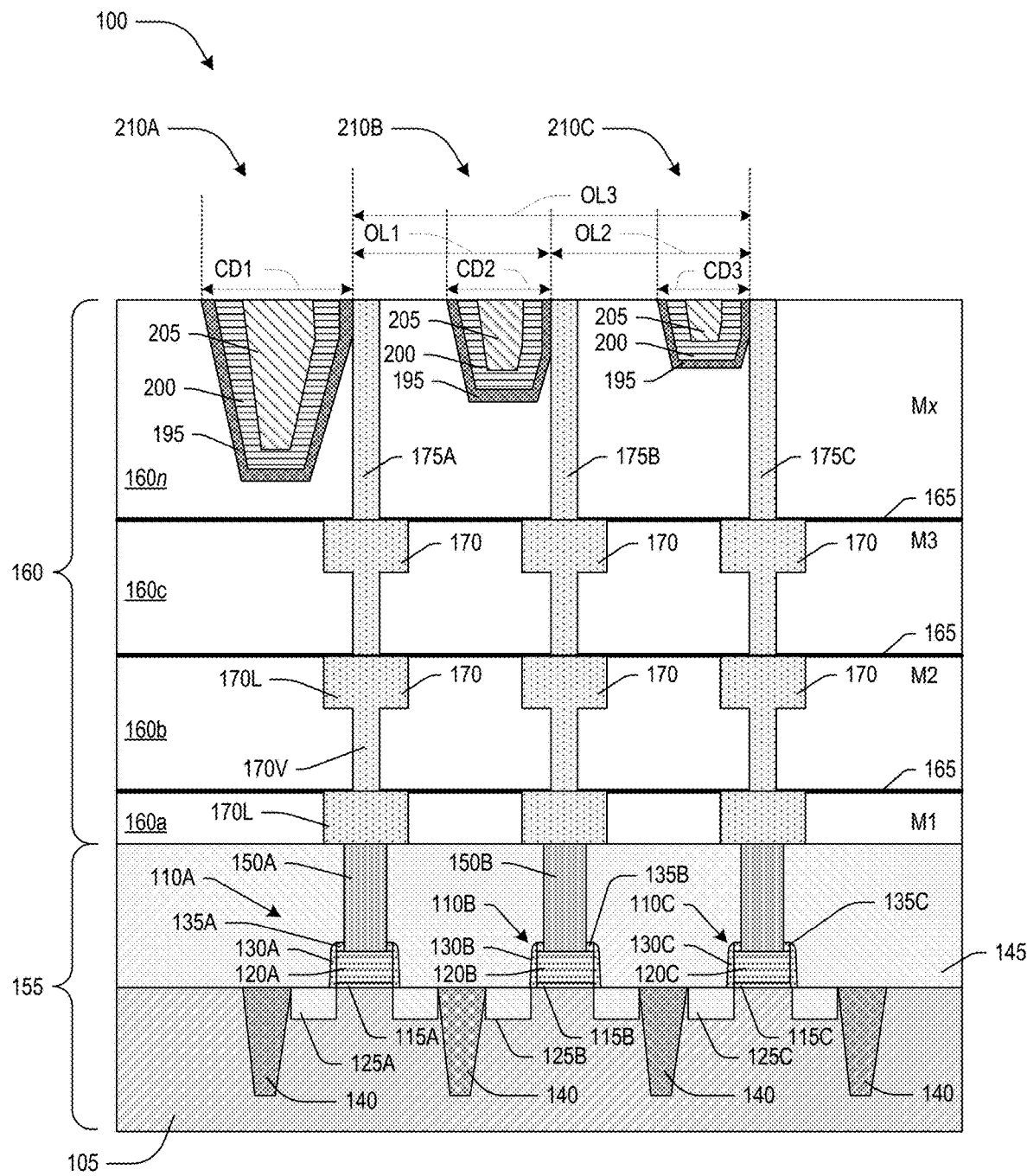

Referring to FIG. 4, a barrier layer 195, a conductive layer 200, and a dielectric layer 205 are formed in the trenches 190A, 190B, 190C, and a planarization process is performed to remove portions of the barrier layer 195, the conductive layer 200, and the dielectric layer 205 extending outside the trenches 190A, 190B, 190C and to remove the mask 185, according to some embodiments. The barrier layer 195 conductively contacts the portions 192A, 192B, 192C of the sidewalls of the conductive contacts 175A, 175B, 175C, respectively. The barrier layer 195, the conductive layer 200, the dielectric layer 205, the conductive contacts 150A, 150B, 150C, 170, 175A, 175B, 175C, and the devices 110A, 110B, 110C define trench resonators 210A, 210B, 210C. In some embodiments, the barrier layer 195 and the conductive layer 200 are generally U-shaped.

In some embodiments, the barrier layer 195 comprises TiN, TaN, W, Ti, Ta, or some other suitable barrier material. In some embodiments, the barrier layer 195 is formed by at least one of ALD, PVD, CVD, LPCVD, ALCVD, UHVCVD, RPCVD, MBE, or other suitable techniques. In some embodiments, the conductive layer 200 comprises W, Cu, Al, AlCu, AlSiCu, or some other suitable material. In some embodiments, where the conductive layer 200 comprises multiple metals, the relative percentages of the metals may vary. In some embodiments, the conductive layer 200 is formed by at least one of ALD, PVD, CVD, LPCVD, ALCVD, UHVCVD, RPCVD, MBE, plating, or other suitable techniques. In some embodiments, a thickness of the conductive layer 200 is at least about 100 Angstroms. In some embodiments, the dielectric layer 205 comprises undoped silicon glass (USG), SiN, phosphorous-doped silicon glass (PSG), fluorine-doped silicon glass (FSG), a low-k material, an ELK material, Black Diamond™ (BD), or other suitable dielectric material. In some embodiments, the dielectric layer 205 is formed by at least one of ALD, PVD, CVD, LPCVD, ALCVD, UHVCVD, RPCVD, MBE, or other suitable techniques. In some embodiments, the dielectric layer 205 is the same material in all of the trenches 190A, 190B, 190C. In some embodiments, a thickness of the dielectric layer 205 is at least about 100 Angstroms.

Figure 5:
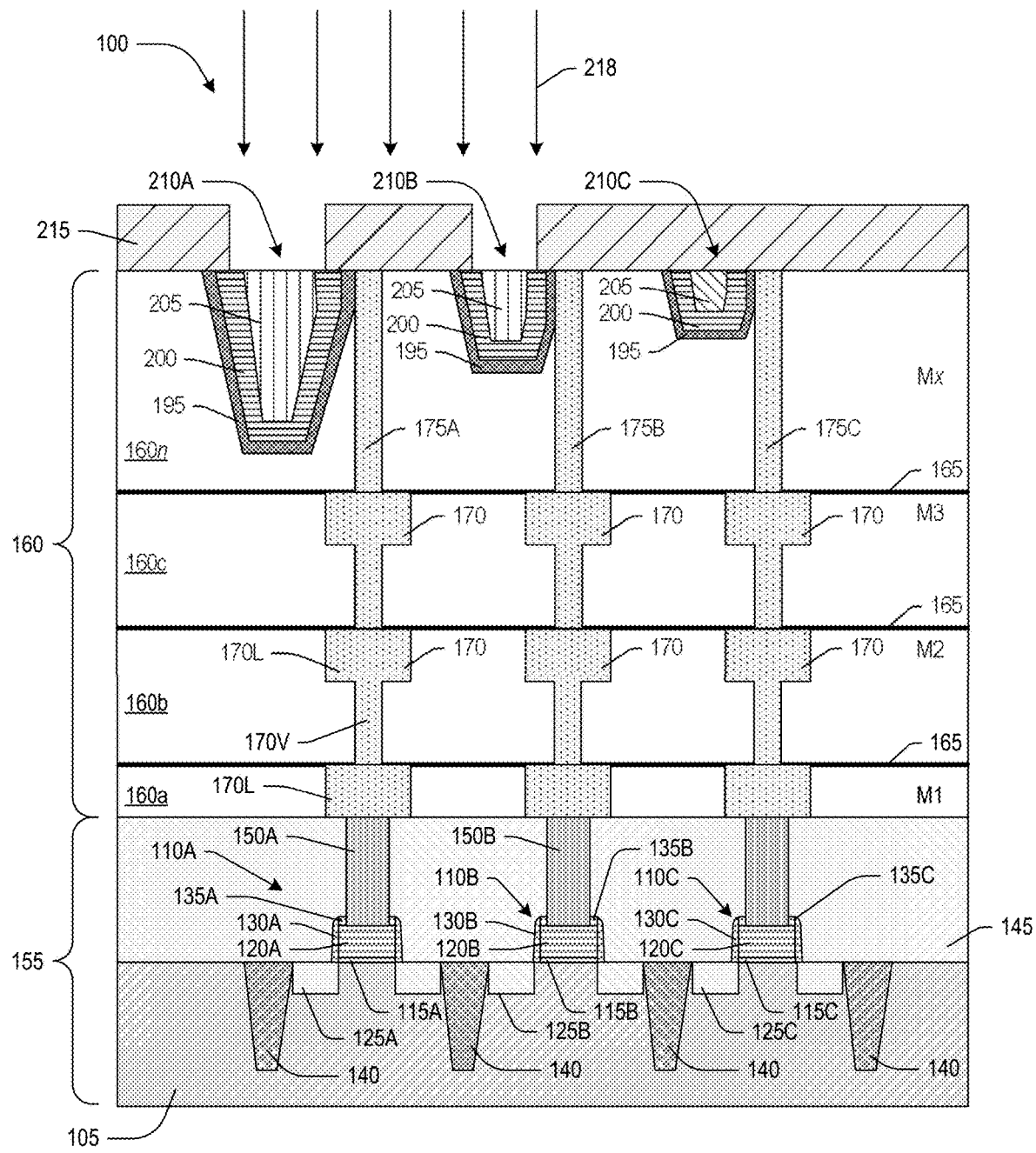

Referring to FIG. 5, in some embodiments, the dielectric layer 205 is modified in one or more of the trenches 190A, 190B, 190C. In some embodiments, the dielectric layer 205 is modified by forming a mask 215 over the n-th dielectric layer 160n that exposes the dielectric layer 205 formed in one or more of the trenches 190A, 190B, 190C, such as the trenches 190A, 190B, and an implantation process 218 is performed to introduce a dopant, such as boron, phosphorous, fluorine, carbon, nitrogen, or some other suitable dopant into the exposed portions of the dielectric layer 205. The implanted dopant modifies the dielectric constant of the dielectric layer 205. In some embodiments, one or more processes are performed to selectively replace the dielectric layer 205 in one or more of the trenches 190A, 190B, 190C instead of or in addition to introducing a dopant into the dielectric layer 205.

Figure 6:
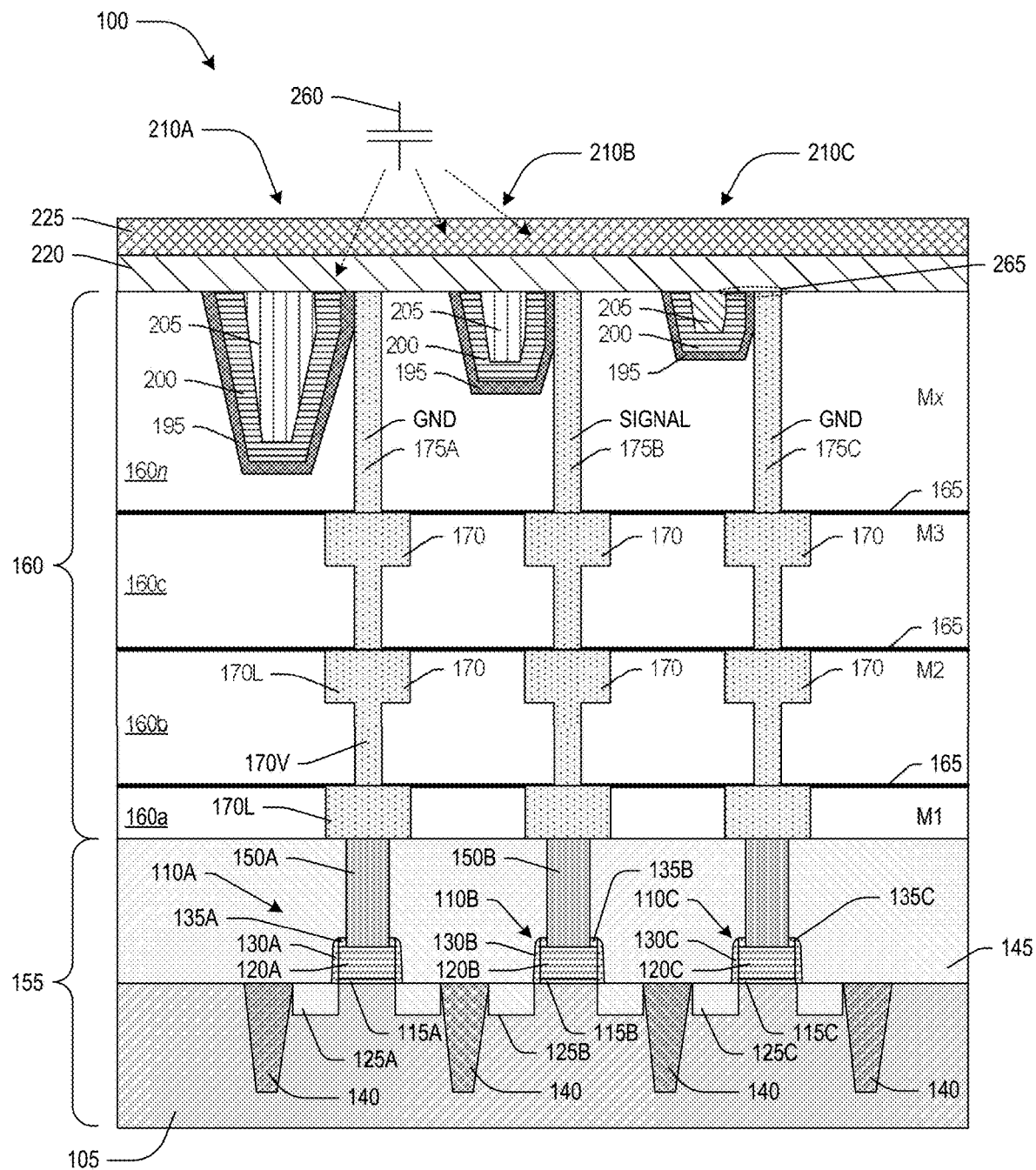

Referring to FIG. 6, the mask 215 is removed and a dielectric layer 220 and a conductive cap layer 225 are formed over the trench resonators 210A, 210B, 210C and the dielectric layer 160n, according to some embodiments. In some embodiments, the dielectric layer 220 comprises USG, SiN, PSG, FSG, a low-k material, an ELK material, BD, or other suitable dielectric material. In some embodiments, the dielectric layer 220 is formed by at least one of ALD, PVD, CVD, LPCVD, ALCVD, UHVCVD, or other suitable techniques. In some embodiments, the conductive cap layer 225 comprises W, Cu, Al, AlCu, AlSiCu, or some other suitable material. In some embodiments, where the conductive cap layer 225 comprises multiple metals, the relative percentages of the metals may vary. In some embodiments, the conductive cap layer 225 is formed by at least one of ALD, PVD, CVD, LPCVD, ALCVD, UHVCVD, RPCVD, MBE, plating, or other suitable techniques.

Figure 7:
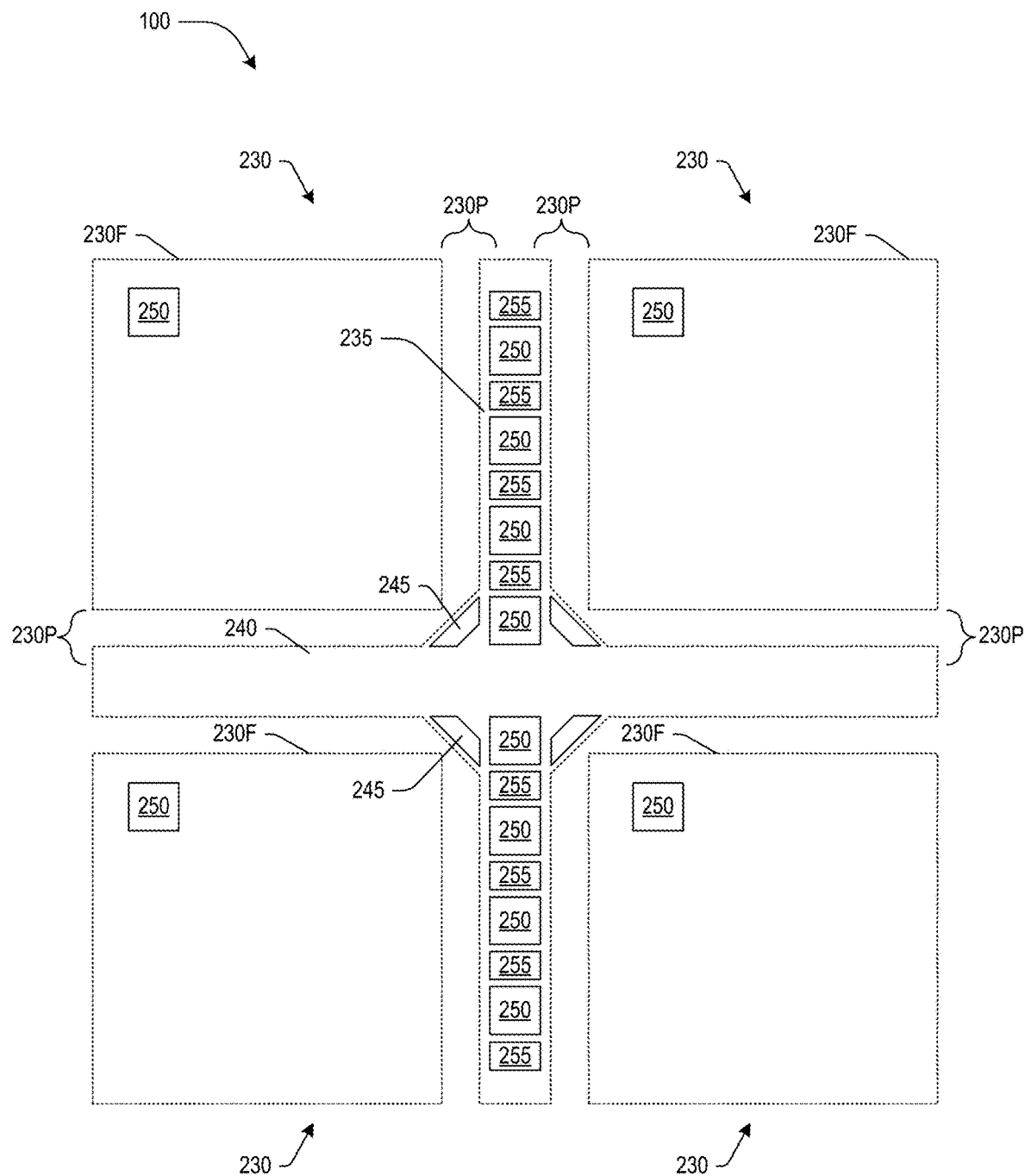
FIG. 7 is a top view of a semiconductor wafer including the semiconductor structure, in accordance with some embodiments.

Referring to FIG. 7, a top view of a semiconductor wafer including the semiconductor structure 100 is provided. Die regions 230 are separated by scribe lines 235, 240. In some embodiments, each die region 230 comprises a functional region 230F and a peripheral region 230P outside the functional region 230F. In some embodiments, the peripheral region 230P is defined as a region outside the functional region 230F including a portion of the scribe line 235, 240 that remains after a dicing operation that singulates the die regions 230 for individual packaging. During the dicing operation some, but not all of the scribe line 235, 240 is removed. In some embodiments, at least 10% of the scribe line 235, 240 remains after dicing. In some embodiments, corner stress relief structures 245 are provided at the intersection of the scribe lines 235, 240. In some embodiments, the trench resonators 210A, 210B, 210C define a monitoring structure 250. In some embodiments, a first instance of the monitoring structure 250 comprises first instances of the trench resonators 210A, 210B, 210C, and a second instance of the monitoring structure 250 comprises second instances of the trench resonators 210A, 210B, 210C. In some embodiments, the first instance of the monitoring structure 250 comprises different materials compared to the second instance of the monitoring structure 250. For example, a first instance of the monitoring structure 250 comprises a first conductive contact 175A in the n-th dielectric layer 160n coupled to a first device 110A, a second conductive contact 175B in the n-th dielectric layer 160n coupled to a second device 110B, a first trench resonator 210A coupled to the first conductive contact 175A, and a second trench resonator 210B coupled to the second conductive contact 175B. The first trench resonator 210A and the second trench resonator 210B comprise a first conductive layer (e.g., a first instance of the conductive layer 200) and a first dielectric layer (e.g., a first instance of the dielectric layer 205). A second instance of the monitoring structure 250 comprises a third conductive contact (e.g., a second instance of the first conductive contact 175A) in the n-th dielectric layer 160n coupled to a third device (e.g., a second instance of the first device 110A, a fourth conductive contact (e.g., a second instance of the second conductive contact 175B) in the n-th dielectric layer 160n coupled to a fourth device (e.g., a second instance of the second device 110B), a third trench resonator (e.g., a second instance of the first trench resonator 210A) coupled to the third conductive contact, a fourth trench resonator (e.g., a second instance of the second trench resonator 210B) coupled to the fourth conductive contact. The third trench resonator and the fourth trench resonator comprise a second conductive layer (e.g., a second instance of the conductive layer 200) and a second dielectric layer (e.g., a second instance of the dielectric layer 205).

As illustrated in FIG. 7, monitoring structures 250 are positioned in at least one of the scribe lines 235, 240. In some embodiments, dummy patterns 255 are positioned in at least one of the scribe lines 235, 240, such as between the monitoring structures 250. In some embodiments, monitoring structures 250 are provided in the functional regions 230F. In some embodiments, selected monitoring structures 250 may have different characteristics, such as different barrier materials, different conductive materials, different dielectric materials, different trench depths, different underlying device characteristics, or other differences. According to some embodiments, the monitoring structures 250 in the scribe lines 235, 240 are at least partially destroyed when the wafer on which the semiconductor structure 100 is formed is cut or singulated to form individual semiconductor dies. According to some embodiments, the functional regions 230F comprise devices for one or more of a logic device, a light emitting diode device, a liquid crystal display, a memory device, an image sensor, a processing device, or some other suitable integrated circuit device.

According to some embodiments, the monitoring structures 250 are used to monitor various metrics during the fabrication of the semiconductor structure 100. Fabrication metrics, such as overlay, critical dimension (CD), stress, charging characteristics, radio frequency (RF) performance, or other suitable fabrication metrics can be monitored using the trench resonators 210A, 210B, 210C.

Referring to FIG. 4, the trench resonators 210A, 210B, 210C are employed to monitor overlay and/or critical dimensions, according to some embodiments. A measurement process, such as electron microscopy, optical metrology, scatterometry, or other suitable measurement process, is employed to measure overlay dimensions OL1, OL2, OL3 and/or critical dimension measurements CD1, CD2, CD3. The overlay and/or critical dimension measurements may be used for fault detection, process control, yield estimation, and/or to determine other suitable fabrication parameters.

Referring to FIG. 6, the trench resonators 210A, 210B, 210C are employed to monitor stress, according to some embodiments. The conductive cap layer 225, the dielectric layer 220, and the trench resonators 210A, 210B, 210C define parallel capacitors, collectively referenced by an equivalent capacitor 260. In some embodiments, stress may cause delamination at an interface 265 between the dielectric layer 220 and one or more of the trench resonators 210A, 210B, 210C. Such delamination affects a capacitance of the capacitor 260. A measured capacitance is compared to a reference capacitance to detect delamination. The degree of delamination represents a fault metric that may affect yield and/or performance of the devices in the semiconductor structure 100.

Referring to FIG. 6, a charging performance of the capacitor 260 is monitored, according to some embodiments. In some embodiments, an alternating current (AC) signal is applied across the capacitor 260 to measure charging and discharging cycles of the capacitor 260.

Referring to FIG. 6, the trench resonators 210A, 210B, 210C are employed as waveguides to monitor radio frequency (RF) performance, according to some embodiments. Signals are provided on the conductive contacts 175A, 175B, 175C to measure the RF performance. For example, a reference voltage (e.g., ground (GND)) may be applied to the conductive contacts 175A, 175C and an active voltage signal (SIGNAL) may be applied to the second conductive contact 175B to measure RF performance.

Figure 8:
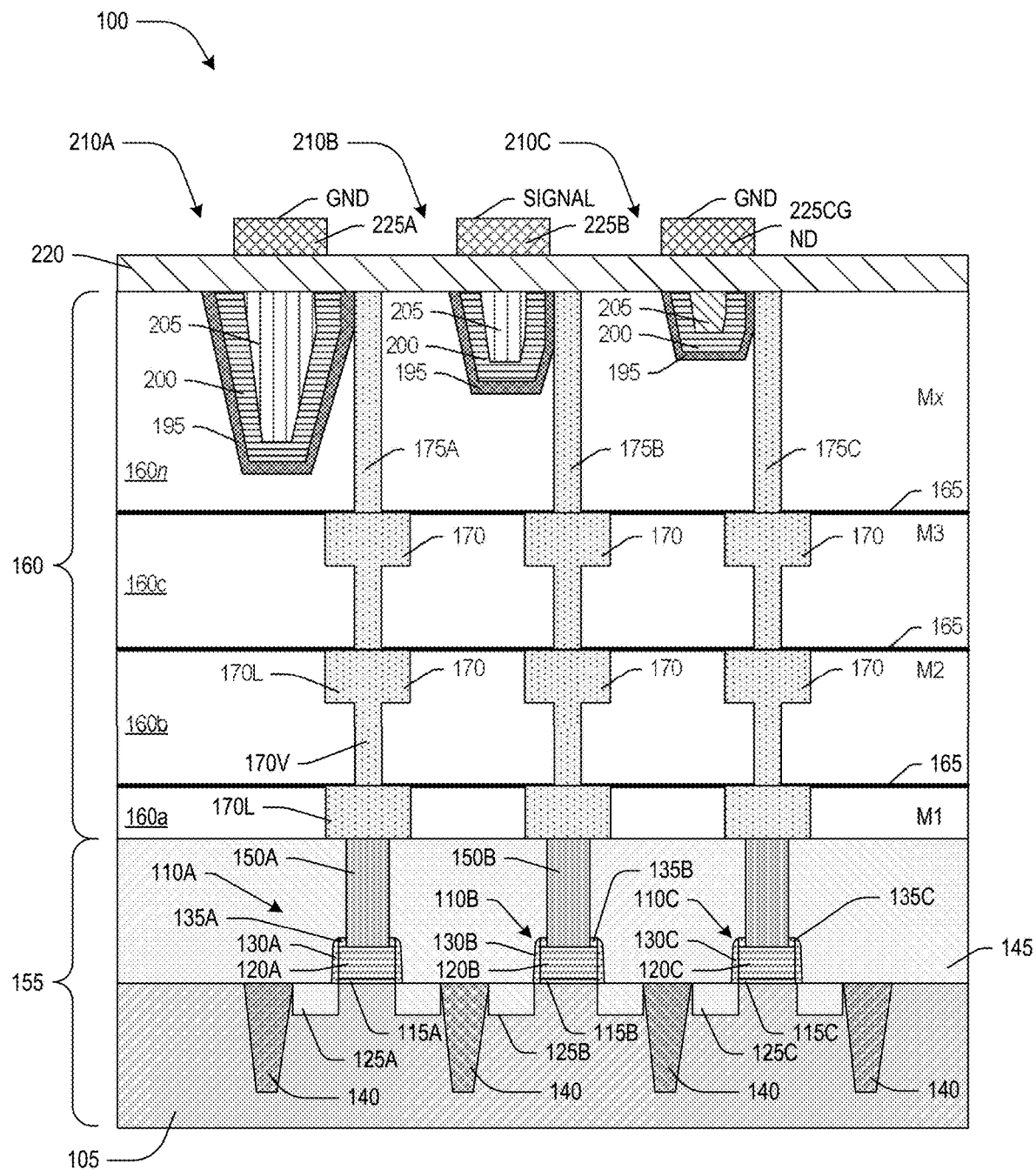
FIG. 8 is a cross-section view of a semiconductor structure, in accordance with some embodiments.

Referring to FIG. 8, the conductive cap layer 225 is patterned to form conductive pads 225A, 225B, 225C, according to some embodiments. In some embodiments, a mask is formed over the conductive cap layer 225 and an etching process is performed using the mask as a template to form the conductive pads 225A, 225B, 225C. The trench resonators 210A, 210B, 210C in FIG. 8 are employed as waveguides to monitor RF performance by applying a reference voltage (e.g., ground (GND)) to the conductive pads 225A, 225C and applying an active voltage signal (SIGNAL) to the conductive pad 225B to measure RF performance. In some embodiments, the conductive pads 225A, 225B, 225C and the associated trench resonators 210A, 210B, 210C define separate capacitors. As described in reference to FIG. 6, capacitance measurements may be used to detect delamination.

Figure 9:
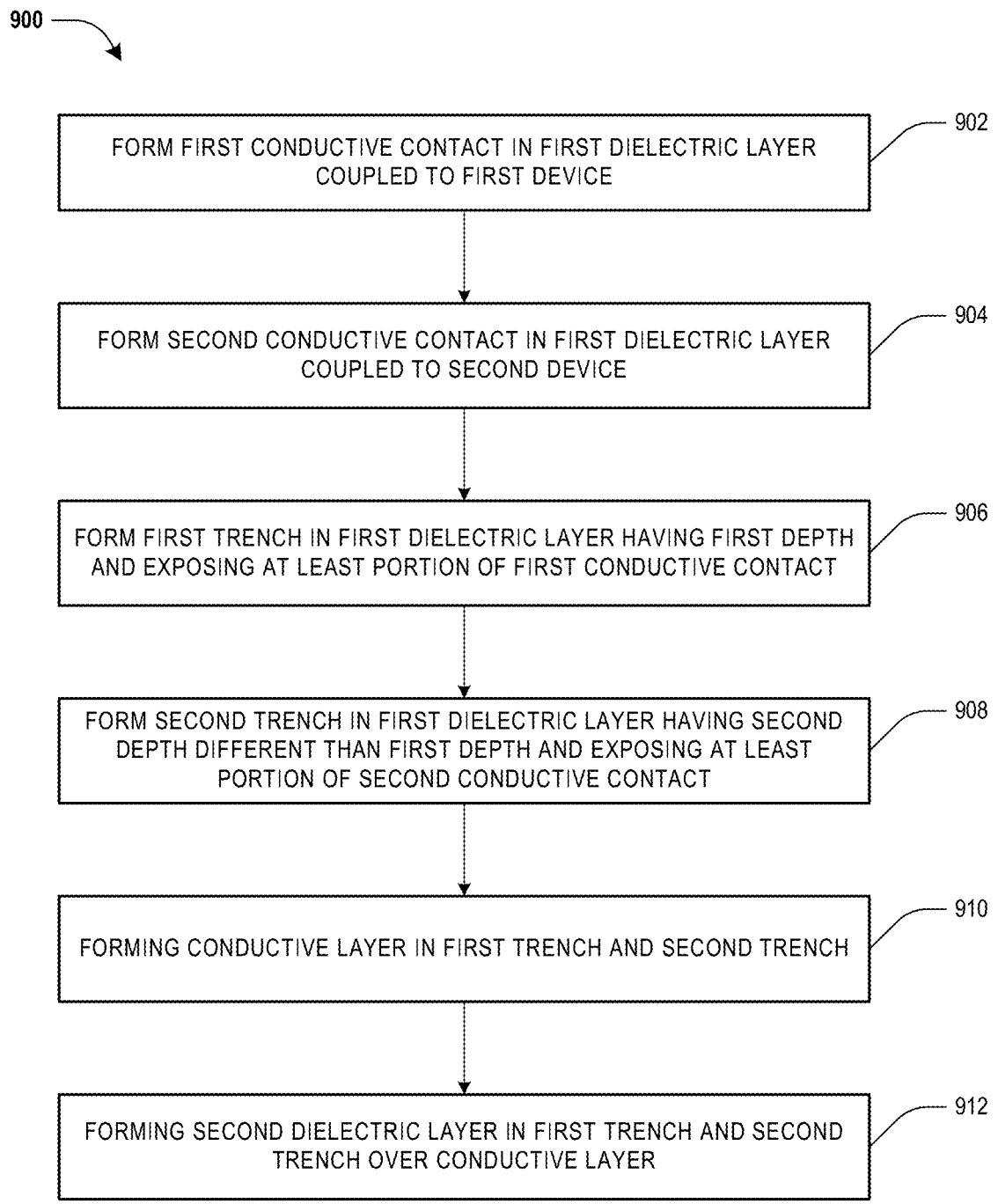
FIG. 9 is a flow chart illustrating a method of forming a semiconductor structure, in accordance with some embodiments.

FIG. 9 is a flow diagram illustrating a method 900 for forming a semiconductor structure 100, in accordance with some embodiments. At 902, a first conductive contact (e.g., 175A, 175B, or 175C) is formed in a first dielectric layer (e.g., the n-th dielectric layer 160n) coupled to a first device (e.g., 110A, 110B, or 110C). At 904, a second conductive contact (e.g., 175A, 175B, or 175C) is formed in the first dielectric layer coupled to a second device (e.g., 110A, 110B, 110C). At 906, a first trench (e.g., 190A, 190B, or 190C) is formed in the first dielectric layer having a first depth (e.g., D1, D2, or D3) and exposing at least a portion of the first conductive contact (e.g., 175A, 175B, or 175C). At 908, a second trench (e.g., 190A, 190B, or 190C) is formed in the first dielectric layer having a second depth (e.g., D1, D2, or D3) different than the first depth (e.g., D1, D2, or D3) and exposing at least a portion of the conductive contact (e.g., 175A, 175B, or 175C). At 910, a conductive layer 200 is formed in the first trench (e.g., 190A, 190B, or 190C) and the second trench (e.g., 190A, 190B, or 190C). At 912, a second dielectric layer (e.g., the dielectric layer 205) is formed in the first trench (e.g., 190A, 190B, 190C) and the second trench (e.g., 190A, 190B, or 190C) over the conductive layer 200.

Figure 10:
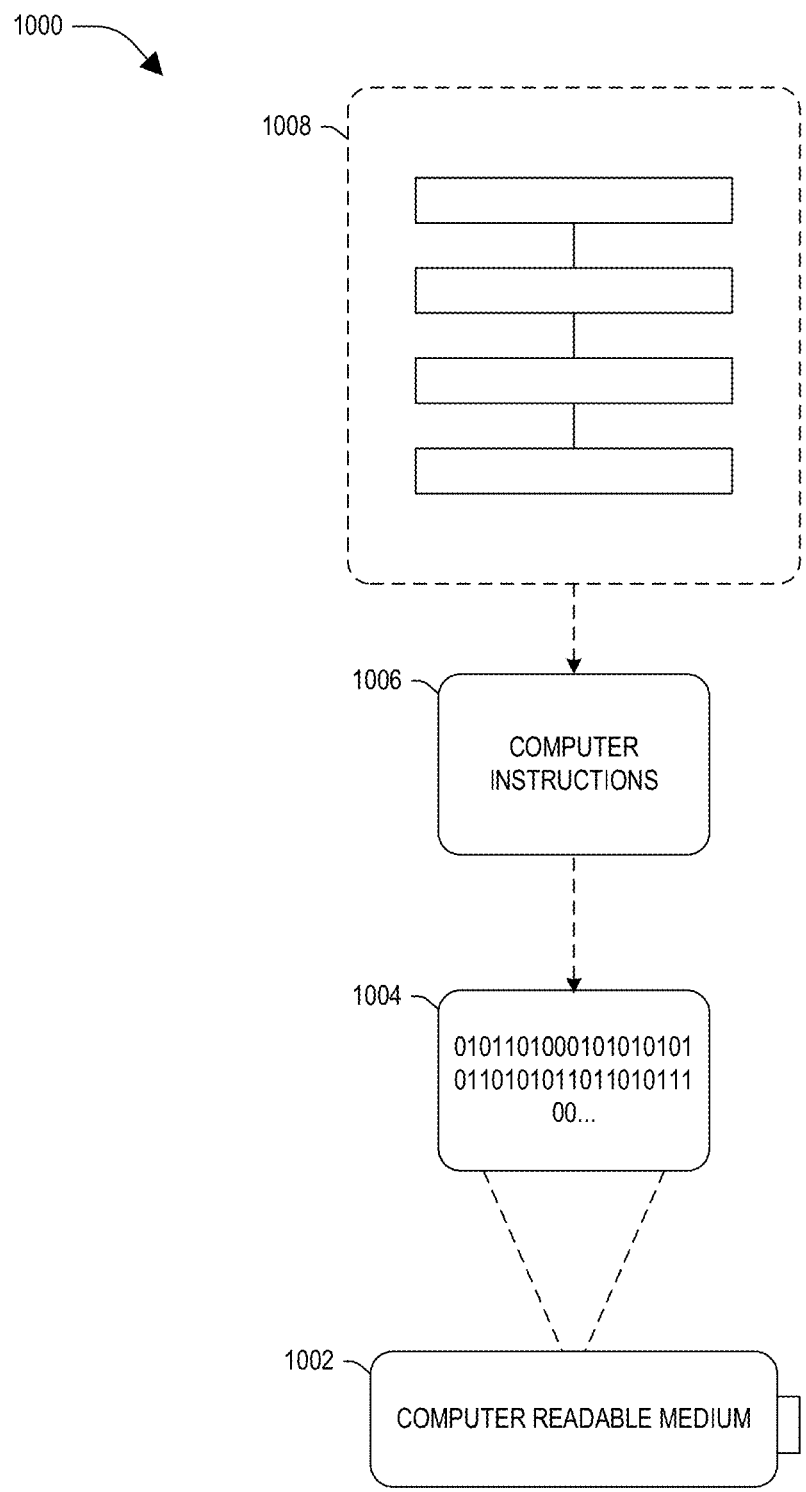
FIG. 10 illustrates an example computer-readable medium wherein processor-executable instructions configured to embody one or more of the provisions set forth herein may be comprised, in accordance with some embodiments.

Still another embodiment involves a computer-readable medium comprising processor-executable instructions configured to implement one or more of the techniques presented herein. An exemplary computer-readable medium is illustrated in FIG. 10, wherein the embodiment 1000 comprises a computer-readable medium 1002 (e.g., a CD-R, DVD-R, flash drive, a platter of a hard disk drive, etc.), on which is encoded computer-readable data 1004. This computer-readable data 1004 in turn comprises a set of processor-executable computer instructions 1006 configured to operate according to one or more of the principles set forth herein. In some embodiments 1000, the processor-executable computer instructions 1006 are configured to perform a method 1008, such as at least some of the aforementioned described methods. In some embodiments, the processor-executable computer instructions 1006 are configured to implement a system, such as at least some of the aforementioned systems. Many such computer-readable media may be devised by those of ordinary skill in the art that are configured to operate in accordance with the techniques presented herein.

Figure 11:
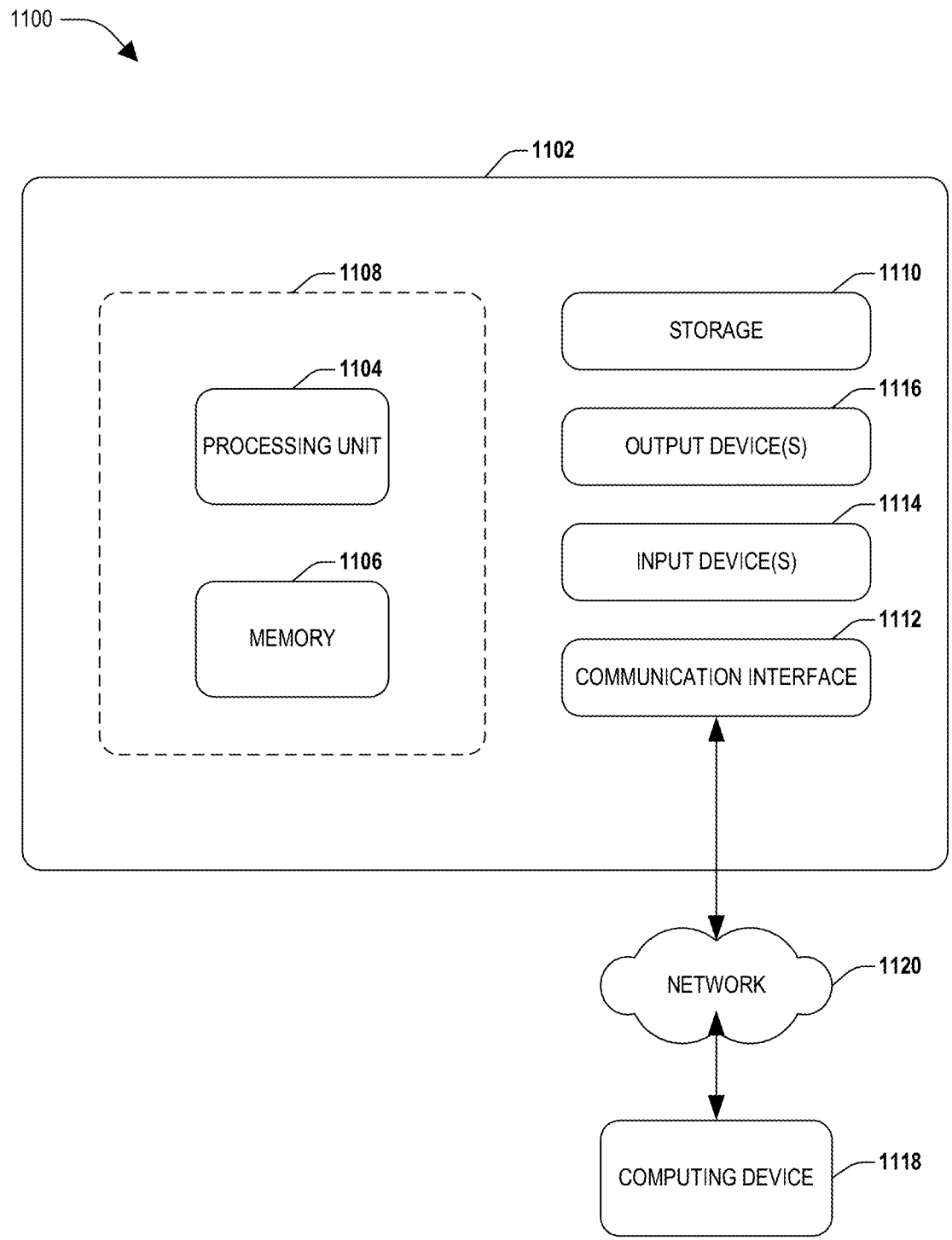
FIG. 11 illustrates an example computing environment wherein one or more of the provisions set forth herein may be implemented, in accordance with some embodiments.

FIG. 11 and the following discussion provide a brief, general description of a suitable computing environment to implement embodiments of one or more of the provisions set forth herein. The operating environment of FIG. 11 is only one example of a suitable operating environment and is not intended to suggest any limitation as to the scope of use or functionality of the operating environment. Example computing devices include, but are not limited to, personal computers, server computers, hand-held or laptop devices, mobile devices (such as mobile phones, Personal Digital Assistants (PDAs), media players, and the like), multiprocessor systems, consumer electronics, mini computers, mainframe computers, distributed computing environments that include any of the above systems or devices, and the like.

Although not required, embodiments are described in the general context of "computer readable instructions" being executed by one or more computing devices. Computer readable instructions may be distributed via computer readable media (discussed below). Computer readable instructions may be implemented as program modules, such as functions, objects, Application Programming Interfaces (APIs), data structures, and the like, that perform particular tasks or implement particular abstract data types. Typically, the functionality of the computer readable instructions may be combined or distributed as desired in various environments.

FIG. 11 depicts an example of a system 1100 comprising a computing device 1102 to implement some embodiments provided herein. In some configurations, computing device 1102 includes at least one processing unit 1104 and memory 1106. Depending on the exact configuration and type of computing device, the memory 1106 may be volatile (such as random-access memory (RAM), for example), non-volatile (such as read-only memory (ROM), flash memory, etc., for example) or some combination of the two. This configuration is illustrated in FIG. 11 by dashed line 1108.

In some embodiments, the computing device 1102 may include additional features and/or functionality. For example, the computing device 1102 may also include additional storage (e.g., removable and/or non-removable) including, but not limited to, magnetic storage, optical storage, and the like. Such additional storage is illustrated in FIG. 11 by storage 1110. In some embodiments, computer readable instructions to implement one or more embodiments provided herein may be in the storage 1110. The storage 1110 may also store other computer readable instructions to implement an operating system, an application program, and the like. Computer readable instructions may be loaded in the memory 1106 for execution by processing unit 1104, for example.

The term "computer readable media" as used herein includes computer storage media. Computer storage media includes volatile and nonvolatile, removable and non-removable media implemented in any method or technology for storage of information such as computer readable instructions or other data. The memory 1106 and storage 1110 are examples of computer storage media. Computer storage media includes, but is not limited to, RAM, ROM, electrically erasable programmable read-only memory (EEPROM), flash memory or other memory technology, CD-ROM, Digital Versatile Disks (DVDs) or other optical storage, magnetic cassettes, magnetic tape, magnetic disk storage or other magnetic storage devices, or any other medium which can be used to store the desired information and which can be accessed by the computing device 1102. Any such computer storage media may be part of the computing device 1102.

In some embodiments, the computing device 1102 comprises a communication interface 1112, or multiple communication interfaces, which allow the computing device 1102 to communicate with other devices. The communication interface 1112 may include, but is not limited to, a modem, a Network Interface Card (NIC), an integrated network interface, a radio frequency transmitter/receiver, an infrared port, a Universal Serial Bus (USB) connection, or other interface for connecting the computing device 1102 to other computing devices. The communication interface 1112 may implement a wired connection or a wireless connection. The communication interface 1112 may transmit and/or receive communication media.

The term "computer readable media" may include communication media. Communication media typically embodies computer readable instructions or other data in a "modulated data signal" such as a carrier wave or other transport mechanism and includes any information delivery media. The term "modulated data signal" may include a signal that has one or more of its characteristics set or changed in such a manner as to encode information in the signal.

The computing device 1102 may include input device(s) 1114 such as keyboard, mouse, pen, voice input device, touch input device, infrared cameras, video input devices, and/or any other suitable input device. An output device(s) 1116 such as one or more displays, speakers, printers, and/or any other suitable output device may also be included in the computing device 1102. The input device(s) 1114 and the output device(s) 1116 may be connected to the computing device 1102 via a wired connection, wireless connection, or any combination thereof. In some embodiments, an input device or an output device from another computing device may be used as the input device(s) 1114 or the output device(s) 1116 for the computing device 1102.

Components of the computing device 1102 may be connected by various interconnects, such as a bus. Such interconnects may include a Peripheral Component Interconnect (PCI), such as PCI Express, a USB, firewire (IEEE 1394), an optical bus structure, and the like. In some embodiments, components of the computing device 1102 may be interconnected by a network. For example, the memory 1106 may be comprised of multiple physical memory units located in different physical locations interconnected by a network.

Those skilled in the art will realize that storage devices utilized to store computer readable instructions may be distributed across a network. For example, a computing device 1118 accessible via a network 1120 may store computer readable instructions to implement one or more embodiments provided herein. The computing device 1102 may access the computing device 1118 and download a part or all of the computer readable instructions for execution. Alternatively, the computing device 1102 may download pieces of the computer readable instructions, as needed, or some instructions may be executed at the computing device 1102 and some instructions may be executed at the computing device 1118.

The trench resonators 210A, 210B, 210C may be used to monitor various metrics during the fabrication of the semiconductor structure 100. Fabrication metrics, such as overlay, critical dimension (CD), stress, charging characteristics, radio frequency (RF) performance, or other suitable fabrication metrics. Fabrication metrics provide indications of yield, performance, defects, and/or efficiency. The fabrication metrics may be used for fault detection, process control, yield estimation, and/or to determine other suitable fabrication parameters.

According to some embodiments, a method of forming a semiconductor structure includes forming a first conductive contact in a first dielectric layer coupled to a first device and forming a second conductive contact in the first dielectric layer coupled to a second device. A first trench is formed in the first dielectric layer having a first depth and exposing at least a portion of the first conductive contact. A second trench is formed in the first dielectric layer having a second depth different than the first depth and exposing at least a portion of the second conductive contact. A first conductive layer is formed in the first trench and the second trench. A second dielectric layer is formed in the first trench and the second trench over the first conductive layer.

According to some embodiments, a semiconductor structure includes a first trench resonator in a first dielectric layer having a first conductive layer and a second dielectric layer and a second trench resonator in the first dielectric layer having a second conductive layer and a third dielectric layer. At least one of a material composition of the second dielectric layer differs from a material composition of the third dielectric layer or a material composition of the first conductive layer differs from a material composition of the second conductive layer.

According to some embodiments, a semiconductor structure includes a first die region having a functional region and peripheral region outside the functional region and a first monitoring structure in the peripheral region. The first monitoring structure includes a first trench resonator having a first conductive layer and a first dielectric layer and a second trench resonator having a second conductive layer and a second dielectric layer. A material composition of the first dielectric layer differs from a material composition of the second dielectric layer.

The foregoing outlines features of several embodiments so that those of ordinary skill in the art may better understand various aspects of the present disclosure. Those of ordinary skill in the art should appreciate that they may readily use the present disclosure as a basis for designing or modifying other processes and structures for carrying out the same purposes and/or achieving the same advantages of various embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc., depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as at least one of etching techniques, planarization techniques, implanting techniques, doping techniques, spin-on techniques, sputtering techniques, growth techniques, or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A method of forming a semiconductor structure, comprising:
   forming a first conductive contact in a first dielectric layer coupled to a first device;
   forming a second conductive contact in the first dielectric layer coupled to a second device;
   forming a first trench in the first dielectric layer having a first depth and exposing at least a portion of the first conductive contact;
   forming a second trench in the first dielectric layer having a second depth different than the first depth and exposing at least a portion of the second conductive contact;
   forming a first conductive layer in the first trench and the second trench; and
   forming a second dielectric layer in the first trench and the second trench over the first conductive layer.

2. The method of claim 1, wherein:
   the first device, the first conductive layer in the first trench, and the second dielectric layer in the first trench define a first trench resonator; and
   the second device, the first conductive layer in the second trench, and the second dielectric layer in the second trench define a second trench resonator.

3. The method of claim 2, comprising:
   forming a third dielectric layer over the first trench resonator, the second trench resonator, and the first dielectric layer; and
   forming a second conductive layer over the third dielectric layer.

4. The method of claim 3, comprising:
   measuring a capacitance of a capacitor defined by the first trench resonator, the second trench resonator, the third dielectric layer, and the second conductive layer.

5. The method of claim 3, comprising:
   applying a first signal to the second conductive layer;
   applying a second signal to the first trench resonator and the second trench resonator; and
   measuring a charging performance metric of a capacitor defined by the first trench resonator, the second trench resonator, the third dielectric layer, and the second conductive layer based on the first signal and the second signal.

6. The method of claim 3, comprising:
   applying a first signal to the first trench resonator;
   applying a second signal to the second trench resonator; and
   measuring a radio frequency performance metric of a capacitor defined by the first trench resonator, the second trench resonator, the third dielectric layer, and the second conductive layer.

7. The method of claim 3, comprising:
   patterning the second conductive layer to define a first conductive pad over the first trench resonator and a second conductive pad over the second trench resonator;
   applying a first signal to the first conductive pad;
   applying a second signal to the second conductive pad; and
   measuring a radio frequency performance metric of the semiconductor structure based on the first signal and the second signal.

8. The method of claim 1, comprising:
   forming a third conductive contact in the first dielectric layer coupled to a third device;
   forming a fourth conductive contact in the first dielectric layer coupled to a fourth device;
   forming a third trench in the first dielectric layer having a third depth and exposing at least a portion of the third conductive contact;
   forming a fourth trench in the first dielectric layer having a fourth depth different than the third depth and exposing at least a portion of the fourth conductive contact;
   forming a second conductive layer in the third trench and the fourth trench; and
   forming a third dielectric layer in the third trench and the fourth trench over the second conductive layer, wherein at least one of:
      a material composition of the second dielectric layer differs from a material composition of the third dielectric layer, or
      a material composition of the first conductive layer differs from a material composition of the second conductive layer.

9. The method of claim 1, comprising:
   forming a third dielectric layer over the second dielectric layer, the first conductive contact, and the second conductive contact; and
   forming a second conductive layer over the third dielectric layer.

10. The method of claim 1, wherein:
    the first device comprises a first transistor having a first gate dielectric layer with a first thickness; and
    the second device comprises a second transistor having a second gate dielectric layer with a second thickness different than the first thickness.

11. The method of claim 1, comprising:
    modifying the second dielectric layer in at least one of the first trench or the second trench.

12. A method of forming a semiconductor structure, comprising:
    forming a first trench in a first dielectric layer, wherein a sidewall of a first conductive contact is exposed through the first trench;
    forming a first barrier layer in the first trench;
    forming a first conductive layer in the first trench, wherein the first conductive layer is separated from the first conductive contact by the first barrier layer; and
    forming a second dielectric layer in the first trench over the first conductive layer, wherein the second dielectric layer fills a portion of the first trench remaining after the first conductive layer is formed.

13. The method of claim 12, comprising:
    forming a second trench in the first dielectric layer;
    forming a second conductive layer in the second trench; and
    forming a third dielectric layer in the second trench over the second conductive layer.

14. The method of claim 13, wherein a material composition of the second dielectric layer differs from a material composition of the third dielectric layer.

15. The method of claim 13, wherein a material composition of the first conductive layer differs from a material composition of the second conductive layer.

16. The method of claim 13, wherein a material composition of the second dielectric layer differs from a material composition of the third dielectric layer.

17. The method of claim 12, wherein a trench resonator is defined in part by the first conductive contact, the first conductive layer, and the second dielectric layer.

18. The method of claim 12, wherein forming the first trench comprises forming the first trench in a scribe line of a semiconductor wafer.

19. The method of claim 12, comprising:
forming a second trench in the first dielectric layer;
forming a second conductive layer in the second trench; and
forming a third dielectric layer in the second trench over the second conductive layer.

20. A method of forming a semiconductor structure, comprising:
forming a first trench in a first dielectric layer, wherein a sidewall of a first conductive contact is exposed through the first trench;
forming a first barrier layer in the first trench and directly contacting the sidewall of the first conductive contact;
forming a first conductive layer in the first trench, wherein the first conductive layer is separated from the first conductive contact by the first barrier layer; and
forming a second dielectric layer in the first trench over the first conductive layer, wherein the second dielectric layer fills a portion of the first trench remaining after the first conductive layer is formed.

* * * * *